(12) United States Patent
Lopatin

(10) Patent No.: US 6,387,818 B1
(45) Date of Patent: May 14, 2002

(54) METHOD OF POROUS DIELECTRIC FORMATION WITH ANODIC TEMPLATE

(75) Inventor: Sergey Lopatin, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 32 days.

(21) Appl. No.: 09/621,156

(22) Filed: Jul. 21, 2000

(51) Int. Cl.[7] .............................................. H01L 21/302
(52) U.S. Cl. ...................... 438/723; 438/724; 438/737
(58) Field of Search ................................ 438/706, 710, 438/712, 723, 724, 725, 737

(56) References Cited

U.S. PATENT DOCUMENTS

| | | | | |
|---|---|---|---|---|
| 4,081,823 A | * | 3/1978 | Cook, Jr. ...................... | 357/47 |
| 5,023,200 A | * | 6/1991 | Blewer et al. ................ | 437/187 |
| 5,668,398 A | * | 9/1997 | Havemann et al. .......... | 257/522 |
| 5,864,172 A | * | 1/1999 | Kapoor et al. ............... | 257/634 |
| 5,946,600 A | * | 8/1999 | Hurwitz et al. .............. | 438/688 |
| 6,033,982 A | | 3/2000 | Lopatin et al. .............. | 438/635 |
| 6,140,252 A | * | 10/2000 | Cho et al. .................... | 438/781 |
| 6,265,321 B1 | * | 7/2001 | Chooi et al. ................. | 438/725 |

OTHER PUBLICATIONS

Modeling and simulation of asymmetric stripline for multi-chip module applications, Lopatin et al., Microelectronic Engineering37/38 (1997) 173–178.

Polycrystallineand MonocrystallinePore Arrays with Large Interpore Distance in Anodic Alumina,Li et al., Electro-chemicaland Solid_State Letters,3 (3) 131–134 (2000), The ElectrochemicalSociety, Inc.

* cited by examiner

*Primary Examiner*—Benjamin L. Utech
*Assistant Examiner*—Kin-Chan Chen

(57) ABSTRACT

A semiconductor structure includes a conductive metal layer having provided thereover in succession a silicon nitride layer, a dielectric layer, and another silicon nitride layer. An aluminum layer is deposited over the silicon nitride layer. The aluminum layer is selectively anodized so that a top portion of porous aluminum oxide is formed over the remaining aluminum. A reactive ion etch is undertaken through the pores of the aluminum oxide to render the remaining aluminum and silicon nitride layer therebelow porous. The aluminum oxide and aluminum are removed, and the remaining porous silicon nitride layer is used as a template or mask for further reactive ion etching there-through to the dielectric layer, so that the dielectric layer is rendered porous, thereby lowering its dielectric constant. As an alternative, reactive ion etching of the dielectric can be undertaken with the porous aluminum oxide layer and porous aluminum layer in place. The etching characteristics of the reactive ion etch step for rendering the dielectric layer porous may be varied so that air gaps rather than pores are formed in the dielectric.

3 Claims, 7 Drawing Sheets

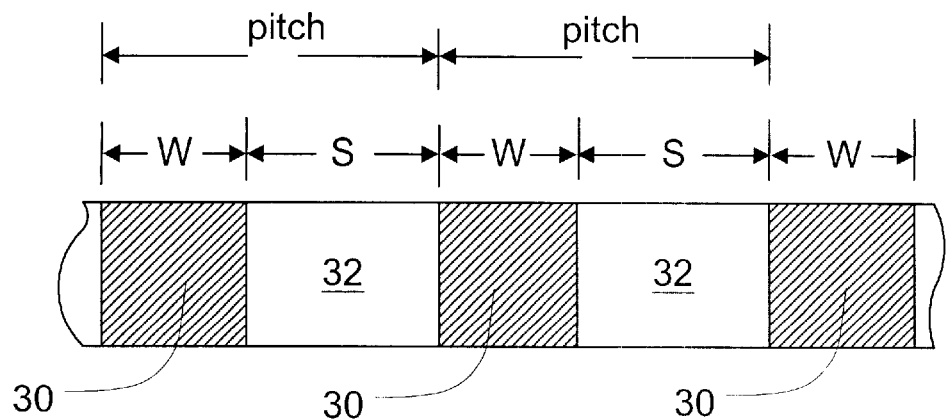
FIGURE 1    (PRIOR ART)
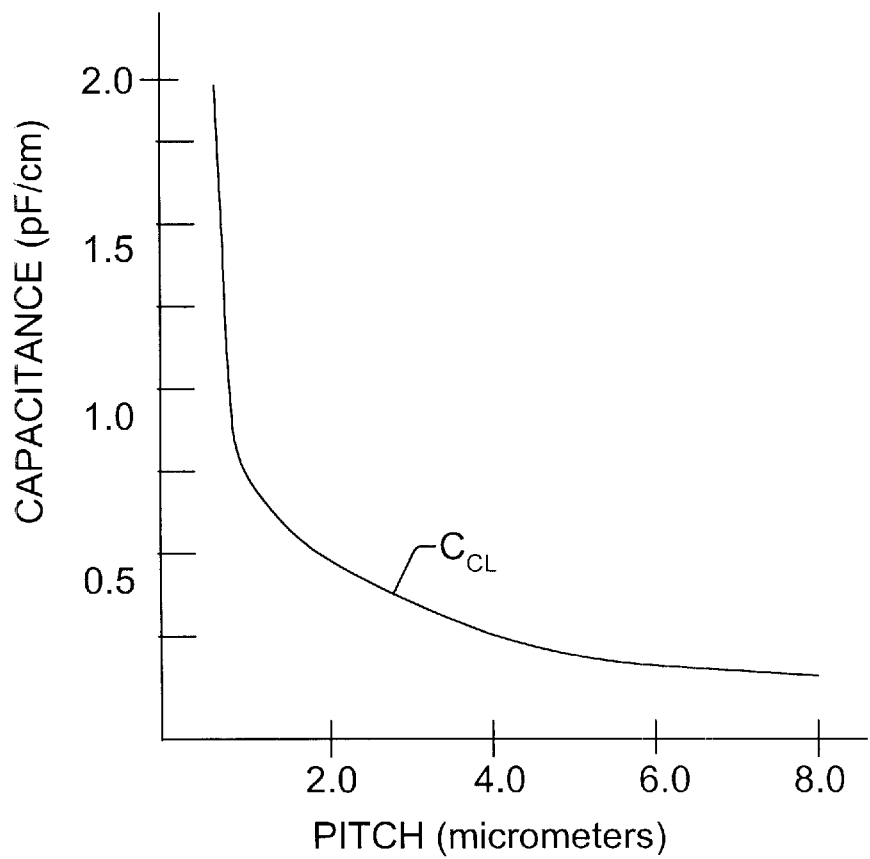
FIGURE 2    (PRIOR ART)

METHOD OF POROUS DIELECTRIC FORMATION WITH ANODIC TEMPLATE

BACKGROUND OF THE INVENTION

1. Field of the Invention

This invention relates generally to dielectrics in semiconductor devices, and more particularly, to a method of lowering the dielectric constant of a dielectric body.

2. Discussion of the Related Art

The increasing demand for miniaturization in the integrated circuit industry has led to an ever constant reduction in separation between conductive (e.g. metal) lines in order to reduce integrated circuit size and/or increase density. This reduced spacing between conductive lines has the undesirable effect of increasing the capacitance of the capacitor formed by adjacent conductive lines and the material lying between the conductive lines.

In the past, overall integrated circuit (IC) performance depended primarily on device properties. However, this is no longer the case. Parasitic resistance, capacitance and inductance associated with conductive lines of an IC are becoming increasingly significant factors in IC performance. In current IC technology, the speed-limiting factor is no longer device delay, but resistive-capacitive (RC) delays associated with the conductive interconnections of the IC.

In ICs employing metal lines with dielectric therebetween, it will be seen that each adjacent pair of metal lines separated by a dielectric forms a capacitor. If the capacitance between adjacent metal lines is high, then the voltage on one metal line alters or affects the voltage on the other, i.e., a significant amount of crosstalk can occur between the metal lines. This alteration in voltage may result in the IC being inoperative as a result of misinterpreting logic zeros, logic ones and voltage levels, and consequently incorrectly processing binary and/or analog information.

FIGS. 1 and 2 illustrate the relationship between closely spaced conductive lines 30 and capacitive coupling. Metal lines 30 are in close proximity to each other and are separated by dielectric 32. These metal lines 30 provide necessary electrical connections between devices of an integrated circuit. Although only three metal lines 30 are shown for ease of understanding, it is to be appreciated that many such lines may exist in the integrated circuit. As noted above, the increasing demand for miniaturization in the integrated circuit industry has led to an ever constant reduction in separation between the metal lines in order to reduce integrated circuit size. However, the reduced spacing between the metal lines 30 has the undesirable effect of increasing the capacitance of the metal-dielectric-metal structure, resulting in increased crosstalk between adjacent metal lines 30.

A quantity known as pitch (pitch=w+s) is often employed in the integrated circuit industry to characterize conductive capacitance cross talk for adjacent conductive lines, where "w" is the cross-sectional width of a conductive line 30, and "s" is the distance of separation between adjacent conductive lines 30. FIG. 2 graphically illustrates the capacitance between the conductive lines as a function of pitch. The reduction in pitch is an ongoing activity in the integrated circuit industry in order to increase device density and performance. The capacitance between the conductive lines 30 (FIG. 2) is shown to increase exponentially as pitch is reduced (part of the reduction in pitch resulting from the lines being brought closer together, i.e., distance "s" decreasing). The increasing capacitive coupling resulting from the conductive lines 30 being brought closer together contributes to capacitive cross talk between the adjacent conductive lines 30.

Efforts have been made to reduce the capacitance of the device formed by adjacent lines of metallization and dielectric therebetween by lowering the dielectric constant of the dielectric layer. In furtherance thereof, attempts have been made to form porous dielectrics by depositing a dielectric layer and undertaking an anneal step. While a porous dielectric does indeed have a lower dielectric constant than a non-porous one, serious problems of compatibility of materials, thermal and mechanical stability, and adhesion of layers have resulted.

With market forces driving the integrated circuit industry toward bringing conductive interconnects closer together, it would be desirable to lower the capacitance of the capacitor formed by adjacent conductive lines and dielectric therebetween by lowering the dielectric constant of the dielectric layer in a simple and effective manner, meanwhile avoiding problems of compatibility of materials, thermal and chemical stability, and adhesion of materials.

SUMMARY OF THE INVENTION

In the present invention, a dielectric body has a silicon nitride layer deposited thereon. An aluminum layer is deposited over the silicon nitride layer, and the aluminum layer is anodized so that a top portion of porous aluminum oxide is formed. A reactive ion etch step is undertaken through the pores of the aluminum oxide to render the remaining aluminum and silicon nitride layer therebelow porous. At this point, the porous aluminum oxide and porous aluminum may be removed, and the remaining porous silicon nitride layer is used as a template or mask for further reactive ion etching therethrough to the dielectric body, so that the dielectric body is rendered porous, thereby lowering its dielectric constant. With the dielectric body disposed between conductive lines, the lowering of the dielectric constant lowers the capacitance of the device formed by the conductors and dielectric.

As an alternative, after the remaining aluminum and silicon nitride layer have become porous, reactive ion etching can be undertaken therethrough to the dielectric body to then render the dielectric body porous, prior to removal of the porous aluminum oxide and porous aluminum.

The etching characteristics of the reactive ion etch step for rendering the dielectric body porous may be varied so that rather than pores, relatively large openings in the form of air gaps are formed in the dielectric.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

FIG. 1 is a cross-sectional view of a prior art semiconductor device including multiple metal lines;

FIG. 2 is a graphical illustration of a relationship between conductive line pitch and capacitive coupling;

DETAILED DESCRIPTION

Reference is now made in detail to specific embodiments of the present invention which illustrate the best mode presently contemplated by the inventor for practicing the invention.

Figure 3:
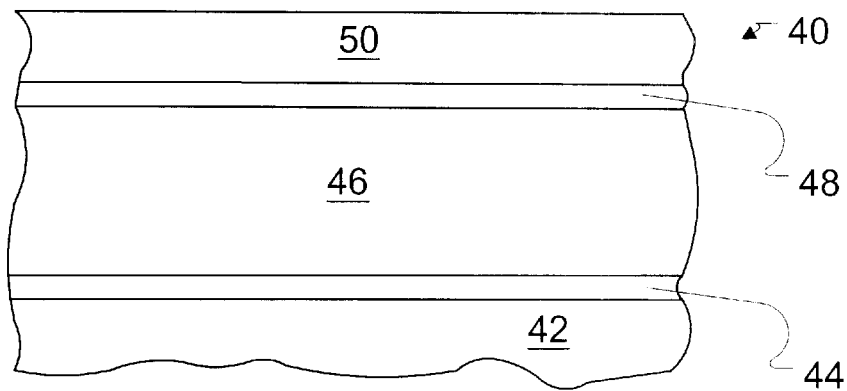
FIG. 3 is a sectional view illustrating an initial step in the process of the present invention.

Referring to FIG. 3, a cross-sectional view of a portion of a semiconductor device 40 is shown. The device 40 includes a conductive copper layer 42, a silicon nitride (SiN) layer 44 thereover, a dielectric layer or body 46 such as silicon dioxide ($SiO_2$) over the silicon nitride layer 44, and a silicon nitride layer 48 over the dielectric layer 46.

Figure 4:
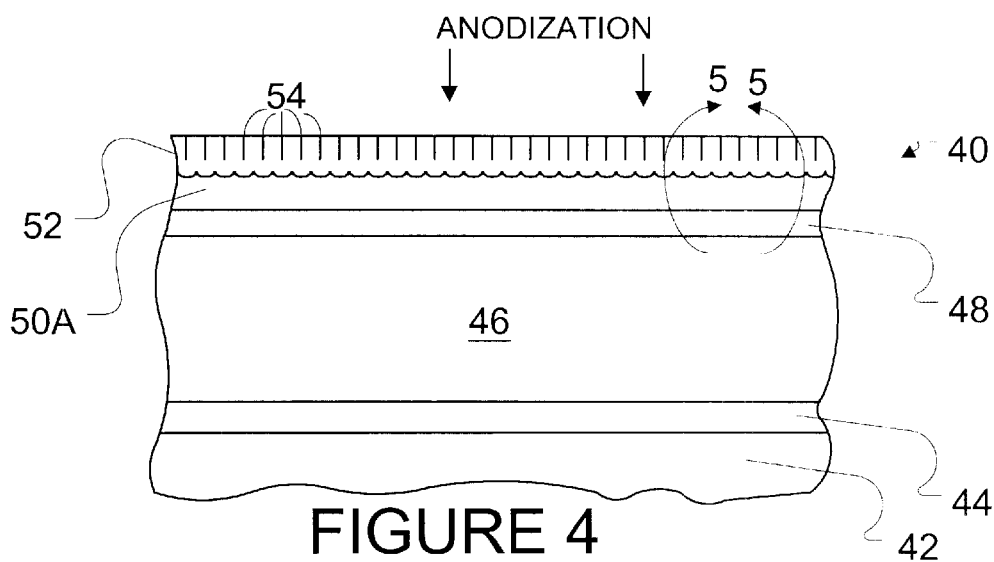
FIG. 4 is a view similar to that shown in FIG. 3, illustrating an anodization step for forming porous aluminum oxide.
Figure 5:
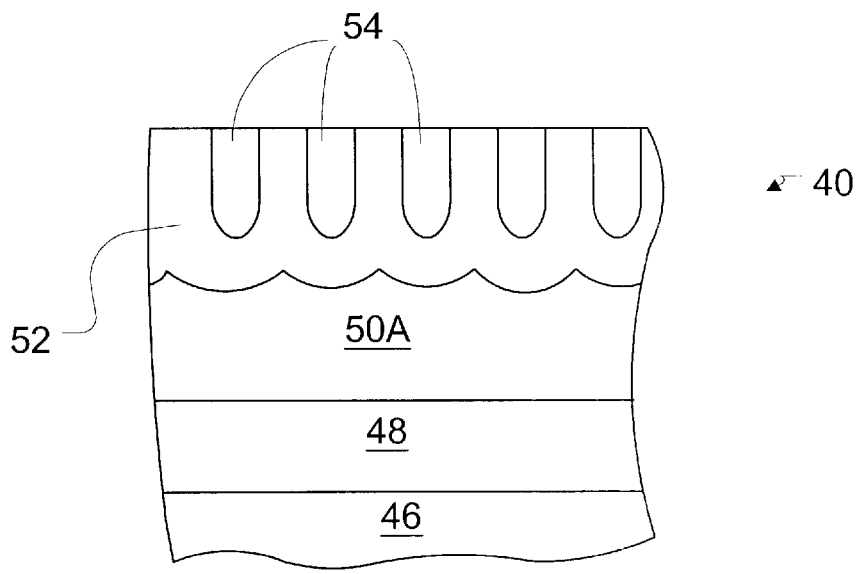
FIG. 5 is an enlarged view of the area 5—5 of FIG. 4.
Figure 6:
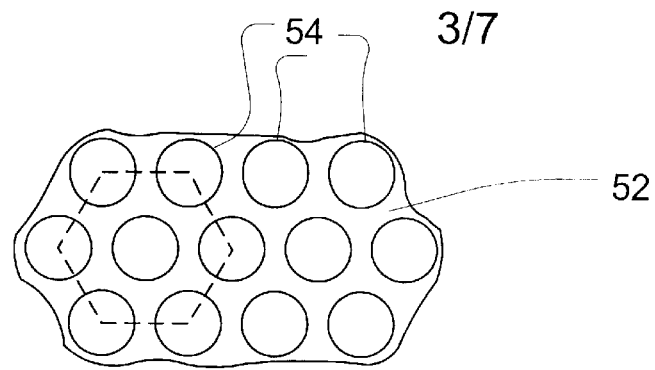
FIG. 6 is a plan view of the device of FIG. 5.

An aluminum 50 layer is deposited over the silicon nitride layer 48, and an anodization step is undertaken (FIG. 4), wherein a portion of the aluminum layer 50 is converted to porous aluminum oxide ($Al_2O_3$) 52 disposed over the remaining aluminum layer 50A. The pores 54 are shown as simple lines in FIG. 4 and in further FIGS. but of course are small openings shown in greater detail in FIGS. 5 and 6. The process of forming the pores 54 is described in the paper entitled "Polycrystalline and Monocrystalline Pore Arrays with Large Interpore Distance in Anodic Alumina", Muller et al., Electrochemical and Solid-State Letters, 3 (3) 131–134 (2000), The Electrochemical Society, Inc., and the paper entitled "Modeling and simulation of asymmetric stripline for multichip module applications", Lopatin et al., Microelectronics Engineering 37/38 (1997) 173–178, both of which are incorporated herein by reference. As set forth in the first-mentioned paper, the spacing between pores 54 and the pore diameter in the aluminum oxide layer 52 can be determined by specifying the type of anodization electrolyte and the anodization parameters (concentration, temperature, voltage), and the pores 54 in the aluminum oxide layer 52 may be laid out in hexagonal fashion (FIG. 6).

Figure 7:
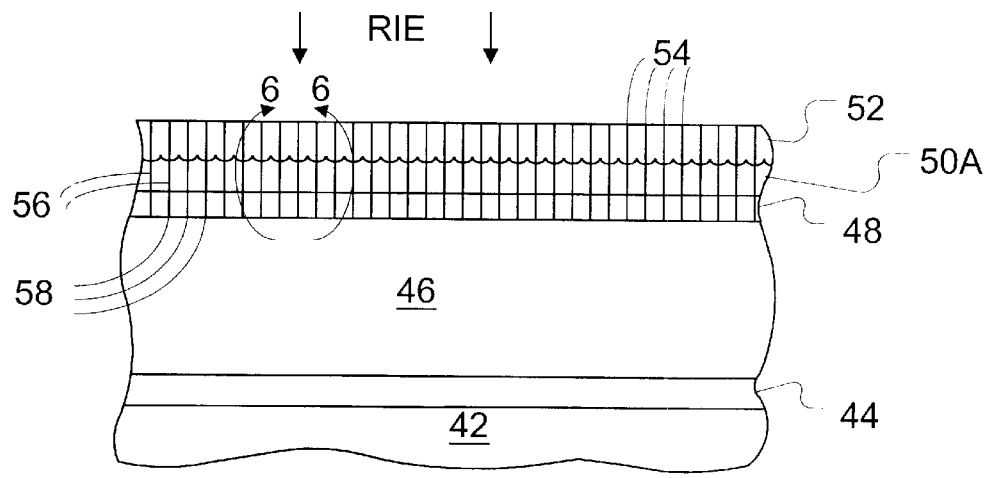
FIG. 7 is a view similar to that shown in FIG. 5, illustrating a further reactive ion etch step.
Figure 8:
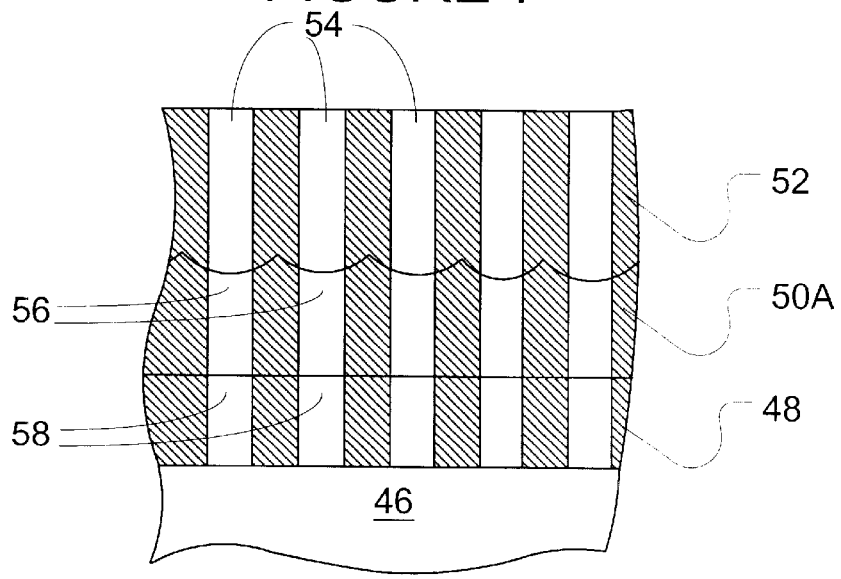
FIG. 8 is an enlarged view of the area 8—8 of FIG. 7.
Figure 9:
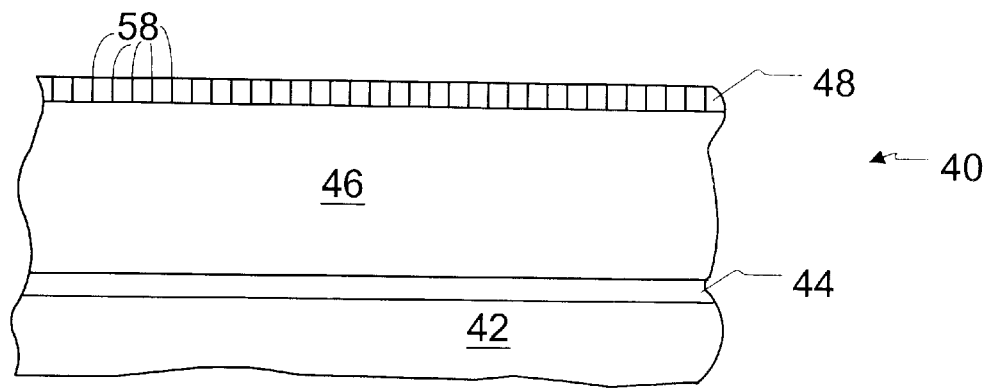
FIG. 9 is a view similar to that shown in FIG. 7 but showing removal of the aluminum oxide and aluminum.
Figure 10:
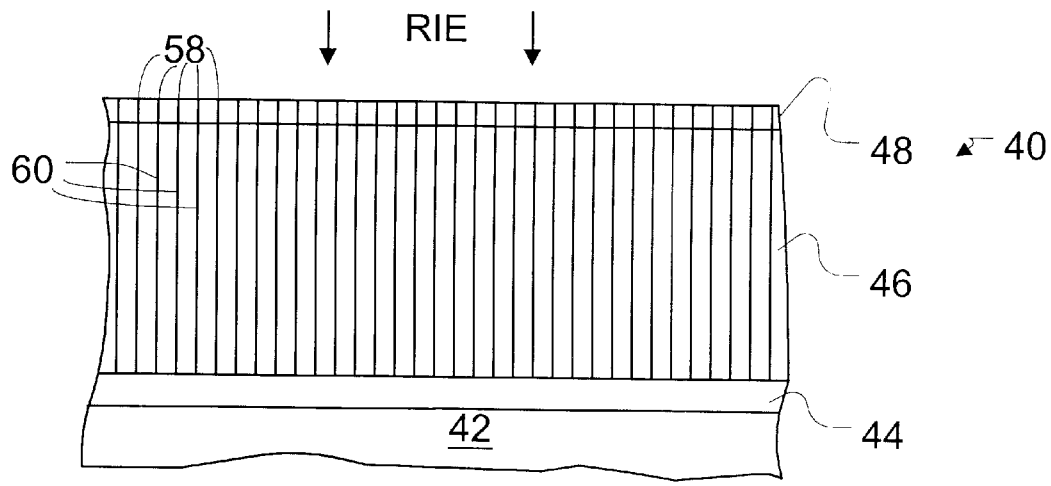
FIG. 10 is a view similar to that shown in FIG. 9 and showing a further reactive ion etch step.

Next, a reactive ion etch (RIE) step is undertaken (FIG. 7), using the porous aluminum oxide layer 52 as a mask or template, to extend the pores 54 through the aluminum oxide layer 52 and form pores 56, 58 in the remaining aluminum layer 50A and the silicon nitride layer 48 therebelow. An enlarged view of a portion of the structure of FIG. 7 is shown in FIG. 8. After removal of the aluminum oxide layer 52 and remaining aluminum layer 50A (FIG. 9), another RIE step is undertaken (FIG. 10), using the porous silicon nitride layer 48 as a mask or template, to form vertical pores 60 in the dielectric layer 46, thereby decreasing the dielectric constant of the dielectric layer 46.

Figure 11:
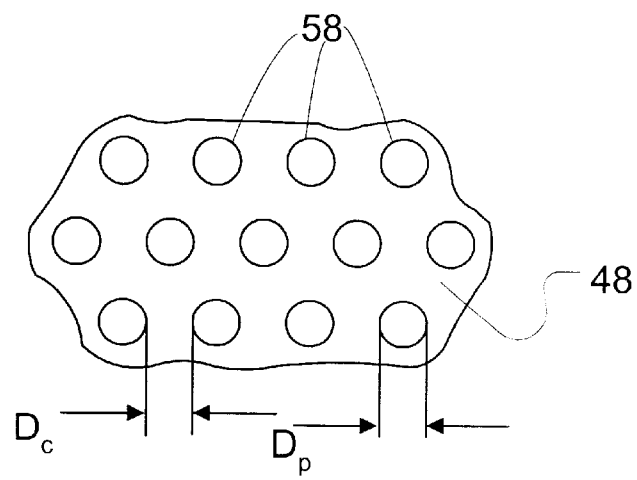
FIG. 11 is a plan view of the structure of FIG. 10, showing layout of the pores in the silicon nitride layer.

As noted above, the spacing between pores and the pore diameter in the aluminum oxide layer (FIG. 6) can be chosen by specifying the type of anodization electrolyte and anodization parameters. The spacing between pores $D_c$ and the pore diameter $D_p$ (FIG. 11) in the silicon nitride layer are dependent on the spacing and diameter of the pores in the aluminum oxide layer and also on the RIE parameters for silicon nitride. The ratio of pore diameter to spacing between pores $D_p/D_c$ in the silicon nitride layer 48 is instrumental in determining the percentage of porosity of the dielectric layer, the RIE parameters for etching dielectric also entering in. A preferred $D_c$ is in the range of 1–10 nm, while a preferred ratio $D_p/D_c$ is 1/1, which will determine a dielectric constant for the porous dielectric of below 2.5.

Figure 12:
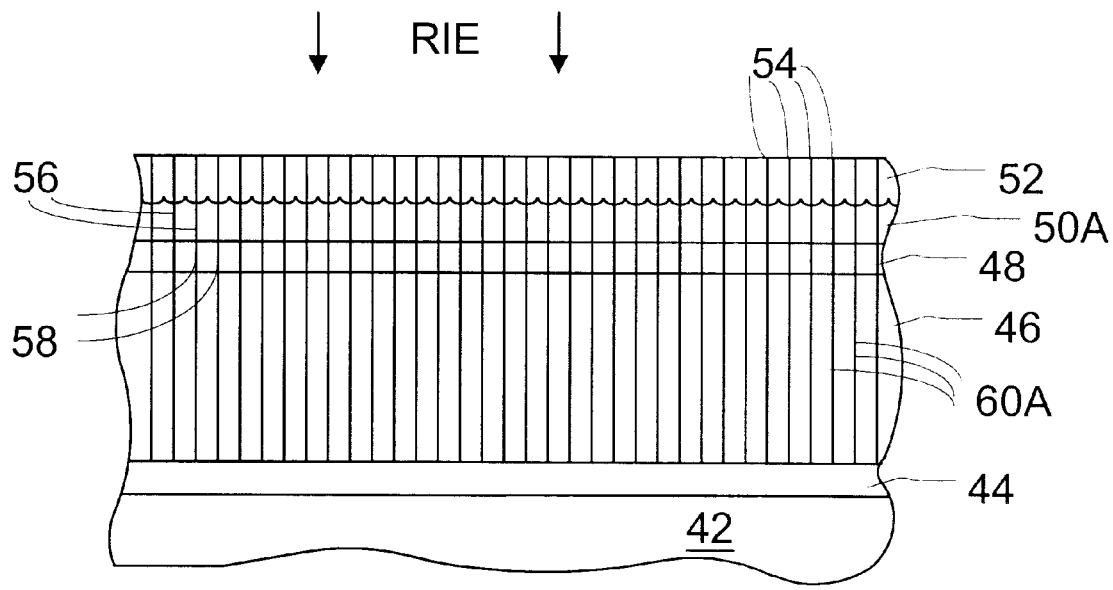
FIG. 12 shows an alternative ion etch step which is undertaken with respect to the structure shown in FIG. 7, i.e., prior to removal of the aluminum and aluminum oxide.
Figure 13:
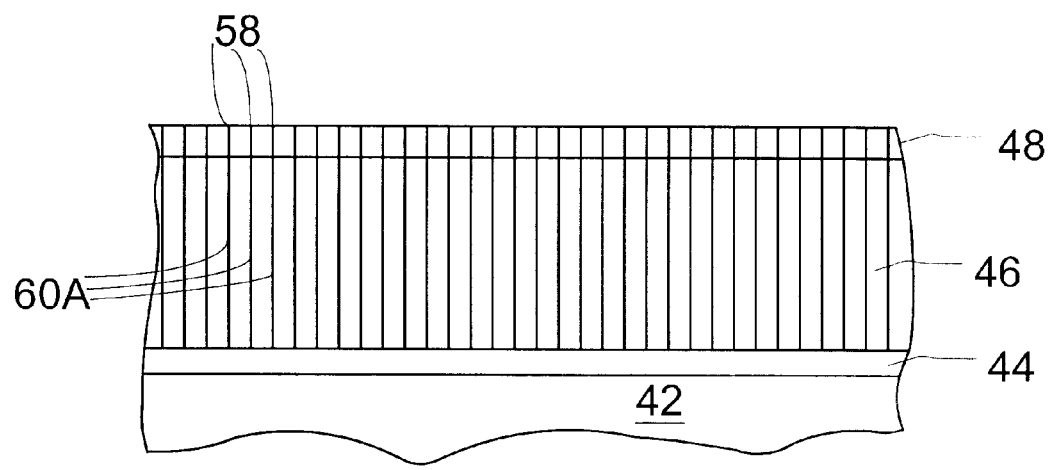
FIG. 13 is a view similar to that shown in FIG. 12 but subsequent to removal of the aluminum oxide and aluminum.

As an alternative, with the structure as shown in FIGS. 7 and 8, that is, and with pores 54, 56, 58 formed respectively in the aluminum oxide layer 52, remaining aluminum layer 50A, and silicon nitride layer 48, a reactive ion etch step can be undertaken (FIG. 12) to form pores 60A in the dielectric layer 46, prior to removal of the aluminum oxide layer 52 and remaining aluminum layer 60A, that is, a using the porous aluminum oxide layer 52, remaining aluminum layer 50A, and silicon nitride layer 48 as a mask or template for the formation of pores 60A in the dielectric 46. Subsequent to forming pores 60A in the dielectric layer 46, the aluminum oxide layer 52 and remaining aluminum layer 50A are removed (FIG. 13), resulting in the same structure as in FIG. 10.

Figure 14:
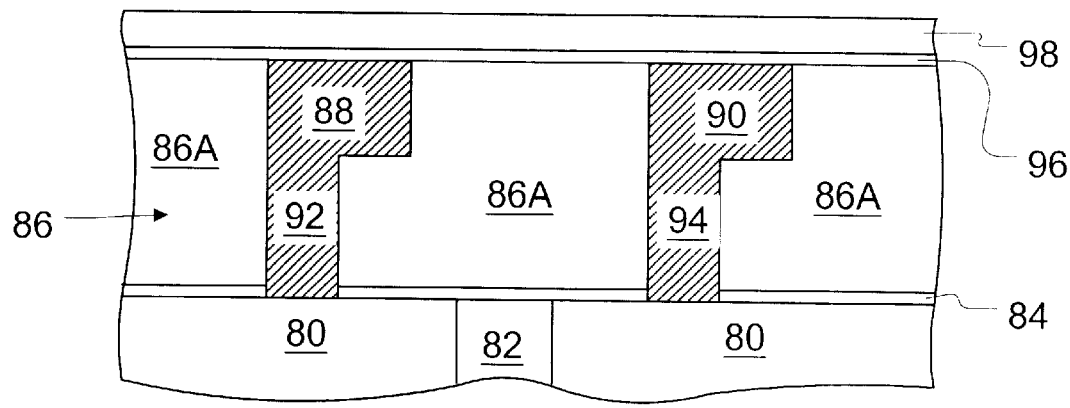
FIG. 14 is a sectional view showing two metal lines separated by dielectric and connected to a lower metal layer by vias, in a first step of applying the invention thereto.
Figure 15:
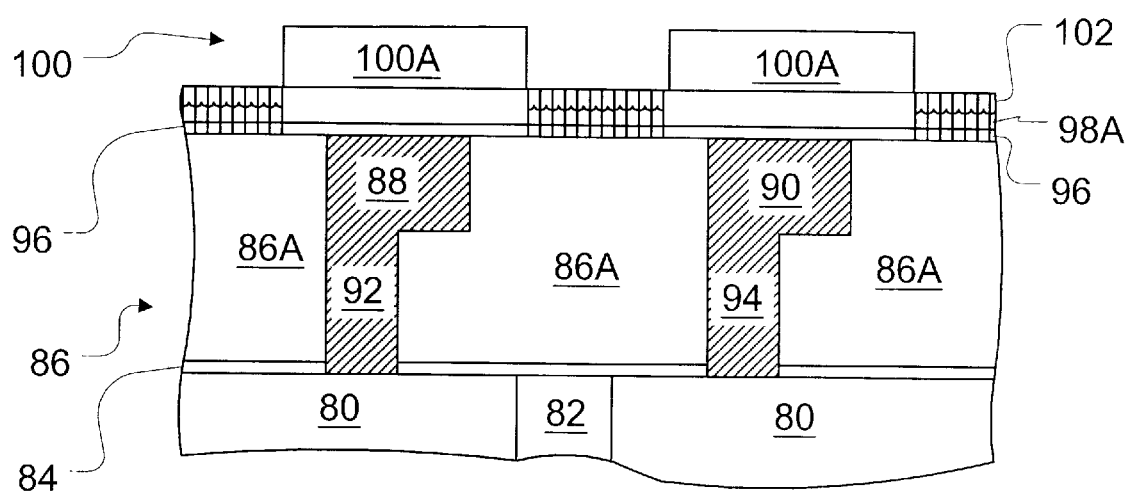
FIG. 15 is a view similar to that shown in FIG. 14, and showing formation of pores in the template above the dielectric.
Figure 16:
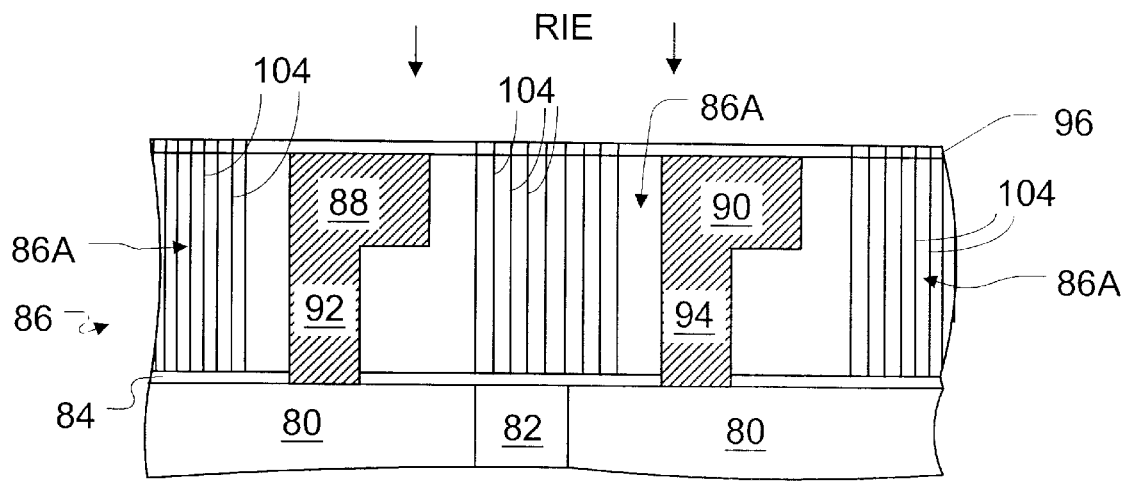
FIG. 16 is a sectional view similar to that shown in FIG. 15, and showing pores formed in the dielectric.

Referring to FIG. 14, the present process is applied to a dual inlaid copper metallization structure. As shown therein, a lower conductive copper layer 80 has portions spaced apart by dielectric 82. A silicon nitride layer 84 is provided thereover, and a dielectric layer 86 is formed over the silicon nitride layer 84. Conductive copper lines 88, 90 are embedded in the dielectric layer 86 and contact the copper layer 80 by means of conductive copper vias 92, 94, the structure being covered by another silicon nitride layer 96. An aluminum layer 98 is deposited over the silicon nitride layer 96. In order to lower the dielectric constant of the dielectric 86A between the lines 88,90 and between the vias 92, 94, a photoresist layer 100 is deposited over the silicon nitride layer 96, and is patterned as shown in FIG. 15. Anodization of the exposed aluminum 98 is undertaken, with the resist portions 100A acting as a mask or template, so that portions of the aluminum between the resist portions are oxidized to form porous aluminum oxide 102. Reactive ion etching of the aluminum oxide 102, aluminum 100, and the silicon nitride layer 96 are undertaken as described above, again using the resist portions 100A as a mask, and then the resist 100 is removed. After removal of the aluminum oxide 102 and remaining aluminum 98, a reactive ion etch is undertaken (FIG. 16) using the silicon nitride layer 96 as a mask so that vertical pores 104 are formed in the dielectric 86A only under the porous areas of the silicon nitride layer 96, the pores 104 extending down to the silicon nitride layer 84. Formation of these pores 104 in the dielectric layer 86 has the effect of decreasing the dielectric constant of the dielectric 86A between the conductive metal lines 88, 90, which in turn decreases the capacitance of the device formed by the metal lines 88, 90 and dielectric. 86A therebetween, reducing crosstalk between the lines 88, 90. The dielectric constant of the dielectric 86A between the conductive vias 92, 94 is likewise reduced, providing the same result with respect to the vias 92, 94.

Again, as an alternative, pores can be formed in the dielectric 86 prior to removal of the porous aluminum oxide 102A and aluminum 98, that is, using the porous aluminum oxide 102A, aluminum 98, and silicon nitride layer 96 between the resist portions 100A as a mask or template for forming the pores in the dielectric 86 during the reactive ion etch step.

Figure 17:
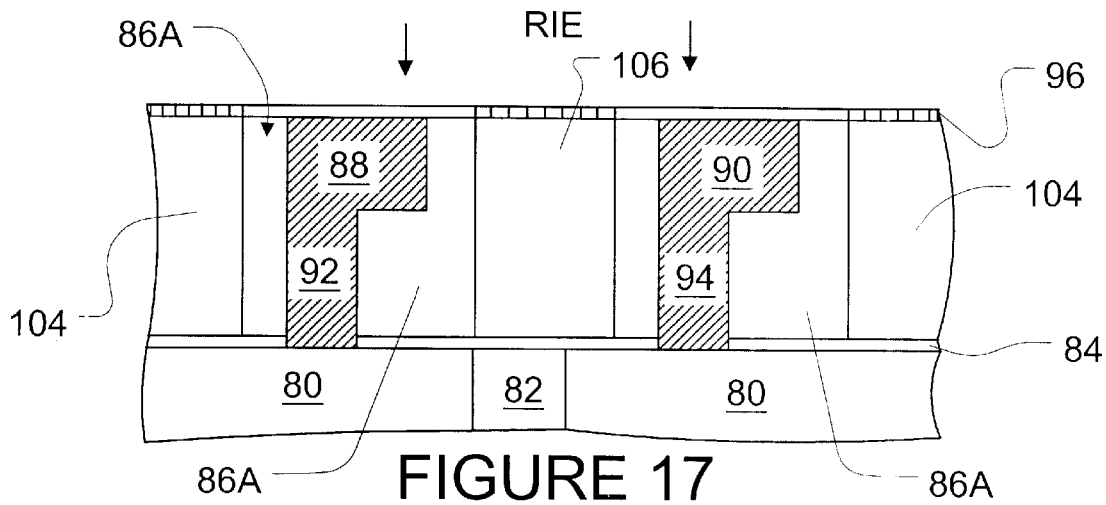
FIG. 17 is a sectional view similar to that shown in FIG. 16, but showing openings formed in the dielectric.
Figure 18:
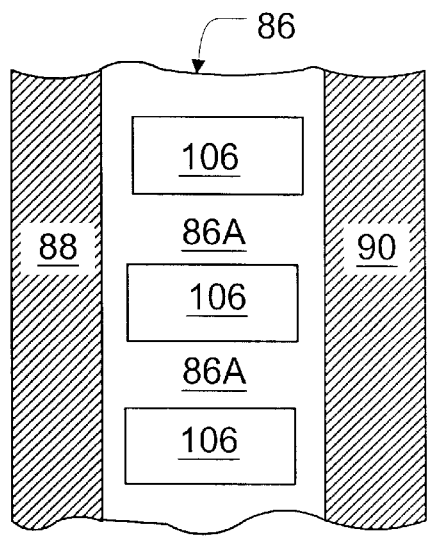
FIG. 18 is a plan view of a portion of the device of FIG. 17.

In the formation of the pores, the reactive ion etch step requires a high degree of aminopropyl, that is to it must be highly directional. By altering the degree of aminopropyl of the reactive ion etch step, rather than pores, an air gap 106, i.e., a relatively large opening, can be formed below each porous area of the silicon nitride layer 96 (FIG. 17), which will lower the dielectric constant of the dielectric 86A between the lines 88, 90 and vias 92, 94. In sum case, the air gaps 106 should be narrow or have a periodic array supported by dielectric separations. The structure with air gaps 106 is shown in plan view in FIG. 18.

It will be seen that porous silicon nitride covers the porous portions of the dielectric (FIG. 16) or air gaps (FIG. 17), while dense silicon nitride covers the dielectric and copper interconnects. The unetched portions of the dielectric provide mechanical stability, with the porous silicon nitride over the porous dielectric (FIG. 16) or air gaps (FIG. 17) also providing mechanical stability and an appropriate planar surface for further device fabrication. It will thus be seen that the problems of the prior art are avoided.

Further steps are then undertaken to provide a dense layer of silicon nitride over the resulting structure and another layer of dielectric for the next level of metallization.

Using a porous template as described above provides the opportunity to form porous dielectric (or air gaps in the dielectric) in the most critical parts of the structure. That is, it will be seen that the dielectric constant of the dielectric between interconnects is reduced. This reduces the capacitance of the devices formed, lowering crosstalk between adjacent metallization. The methods are applicable to conventional damascene structures to build copper interconnects of high reliability, and form porous dielectric between copper interconnect outlines to enhance their performance.

The foregoing description of the embodiment of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of fabricating a semiconductor device comprising:

providing a dielectric body;

providing an aluminum layer over the dielectric body;

anodizing the aluminum layer to form a porous aluminum oxide layer; and etching material under the aluminum oxide layer through the pores thereof, including the dielectric body, to change the dielectric constant of the dielectric body.

2. A method of fabricating a semiconductor structure comprising:

providing a dielectric layer;

providing a nitride layer over the dielectric layer;

providing an aluminum layer over the nitride layer;

anodizing the aluminum layer to form a porous aluminum oxide layer; and etching material under the aluminum oxide layer through the pores thereof, including the nitride layer and dielectric layer, to change the dielectric constant of the dielectric layer.

3. A method of fabricating a semiconductor structure comprising:

providing a dielectric layer;

providing a nitrite layer over the dielectric layer;

providing an aluminum layer over the nitride layer;

anodizing the aluminum layer to form a porous aluminum oxide layer;

etching the nitride layer but not etching the dielectric layer through the pores of the aluminum oxide layer, to form a porous nitride layer;

removing the material over the nitride layer; and etching the dielectric layer through the pores of the nitride layer, to change the dielectric constant of the dielectric layer.

* * * * *